United States Patent [19]
Hino

[11] Patent Number: 5,594,396
[45] Date of Patent: Jan. 14, 1997

[54] PIEZOELECTRIC DEVICE INCLUDING SUBSTANTIALLY PARALLEL PROPAGATION PATHS FOR SECONDARY OSCILLATIONS

[75] Inventor: Taketoshi Hino, Nagaokakyo, Japan

[73] Assignee: Murata Manufacturing Co., Ltd., Japan

[21] Appl. No.: 393,461

[22] Filed: Feb. 23, 1995

[30] Foreign Application Priority Data

Feb. 23, 1994 [JP] Japan .................................. 6-025340
Feb. 23, 1994 [JP] Japan .................................. 6-025341

[51] Int. Cl.$^6$ ........................................... H03H 9/00
[52] U.S. Cl. ........................... 333/189; 333/187; 333/185
[58] Field of Search ........................... 333/185–192; 310/340

[56] References Cited

U.S. PATENT DOCUMENTS

| | | | |
|---|---|---|---|
| 4,196,407 | 4/1980 | Masaie et al. | 333/191 |
| 4,234,860 | 11/1980 | Schumacher et al. | 333/191 |
| 4,821,004 | 4/1989 | Defranould et al. | 333/187 |

FOREIGN PATENT DOCUMENTS

| | | |
|---|---|---|
| 58-11316 | 1/1983 | Japan . |
| 0227417 | 10/1986 | Japan . |
| 4026212 | 1/1992 | Japan . |

Primary Examiner—Benny Lee
Assistant Examiner—Darius Gambino
Attorney, Agent, or Firm—Ostrolenk, Faber, Gerb & Soffen, LLP

[57] ABSTRACT

A piezoelectric device which has a piezoelectric substrate and a plurality of piezoelectric resonators provided on the substrate. The piezoelectric resonators are an energy-confining type, and when a voltage is impressed on the piezoelectric resonators, each of the piezoelectric resonators generates a primary vibration in a direction of the thickness of the substrate and a secondary vibration in a direction on the surface of the substrate. The secondary vibration, in the form of an oscillatory wave, is propagated on the surface of the substrate and is attenuated gradually. At least two of the piezoelectric resonators have propagation paths of secondary vibrations which are substantially parallel to each other so as not to intersect within the substrate.

18 Claims, 5 Drawing Sheets

PIEZOELECTRIC DEVICE INCLUDING SUBSTANTIALLY PARALLEL PROPAGATION PATHS FOR SECONDARY OSCILLATIONS

BACKGROUND OF THE INVENTION

1. Field of the Invention

The present invention relates to a piezoelectric device, and more particularly, to a piezoelectric device which has a plurality of piezoelectric resonators.

2, Description of Related Art

Well-known piezoelectric devices include a type which has a piezoelectric substrate supporting a plurality of piezoelectric resonators. In order to reduce the size of this type of piezoelectric device, a piezoelectric substrate of a smaller size must be used, and accordingly, the intervals between the piezoelectric resonators become smaller.

When the piezoelectric resonators are disposed at short intervals, interference is likely to occur among the resonators, thereby lowering the spurious characteristic of the piezoelectric device. When a voltage is supplied to the piezoelectric resonators, each of the piezoelectric resonators generates a primary vibration in a direction of the thickness of the piezoelectric substrate and also a secondary vibration in a direction along the surface of the piezoelectric device. The secondary vibration is propagated on the surface of the piezoelectric device in the form of an oscillatory wave and is attenuated gradually. However, if the intervals between the piezoelectric resonators are short, the secondary vibration generated by one resonator reaches an adjacent resonator before being attenuated sufficiently and interferes with the primary vibration generated by the adjacent resonator. Thus, the piezoelectric device does not have a good spurious characteristic In the light of the problem, Japanese Utility Model Laid Open Publication No. 58-11316 disclosed a piezoelectric device wherein two piezoelectric resonators are arranged on a piezoelectric substrate such that secondary vibrations generated by the respective resonators are propagated in perpendicular directions which are at angles of about 45 degrees to the peripheral edges of the piezoelectric substrate. This structure is to prevent direct interference between the secondary vibrations of two piezoelectric resonators by arranging the resonators out of the propagation paths of the secondary vibrations generated by each other. In the structure, however, the propagation paths of the secondary vibrations of the two piezoelectric resonators intersect, and the secondary vibrations interfere with each other at the intersection. Then, the interference causes an undesired oscillatory wave, and the undesired oscillatory wave interferes with the primary vibrations of the piezoelectric resonators.

Because of the interference of the undesired wave with primary vibrations, the structure to prevent the direct interference between secondary vibrations is not so effective to improve the spurious characteristic as might have been expected.

SUMMARY OF THE INVENTION

The preferred embodiments of the present invention provide to a piezoelectric device which has no interferences among the piezoelectric resonators and has a good spurious characteristic.

A piezoelectric device according to the preferred embodiments of the present invention includes a plurality of piezoelectric resonators disposed on a piezoelectric substrate, and oscillatory waves generated by at least two of the piezoelectric resonators have propagation paths which are substantially parallel to each other so as not to intersect within the piezoelectric substrate.

The oscillatory waves are waves of secondary vibrations generated by the piezoelectric resonators. In the structure, the propagation paths of the secondary vibrations do not intersect, and the secondary vibrations do not interfere with each other. Consequently, the secondary vibration of each of the piezoelectric resonators do not interfere with a primary vibration of the other piezoelectric resonator.

Another piezoelectric device according to the preferred embodiments of the present invention comprises a plurality of piezoelectric resonators disposed on a piezoelectric substrate, each of the piezoelectric resonators including a plurality of oscillation electrodes, and oscillatory waves generated from the oscillation electrodes of at least two of the piezoelectric resonators have propagation paths which slant with respect to the peripheral edges of the piezoelectric substrate and are substantially parallel to each other so as not to intersect within the piezoelectric substrate.

The oscillatory waves from the oscillation electrodes are waves of secondary vibrations generated by the piezoelectric resonators. The oscillatory waves of the secondary vibrations are propagated on the surface of the piezoelectric substrate, and after they reach the peripheral edges of the piezoelectric substrate, they are reflected thereon and return to the respective piezoelectric resonators. In the above structure, since the oscillatory waves of the secondary vibrations are propagated at an incline or slant with respect to the peripheral edges of the piezoelectric substrate, the oscillatory waves have long propagation paths. Accordingly, the frequency of the secondary vibrations is lowered, and the secondary vibrations of a low frequency do not interfere with the primary vibrations of the piezoelectric resonators. Further, since the propagation paths of the secondary vibrations do not intersect, mutual interference between the secondary vibrations does not occur, and consequently, an undesired oscillatory wave is not created by the mutual interference between the secondary vibrations because no undesired oscillatory wave is created by mutual interference between the secondary vibrations, there is no possibility that an undesired oscillatory wave interferes. with the primary vibrations of the piezoelectric resonators.

Another piezoelectric device according to the preferred embodiments of the present invention comprises a plurality of piezoelectric resonators disposed on a piezoelectric substrate, each of the piezoelectric resonators including a plurality of oscillation electrodes, and the piezoelectric substrate has cutouts at locations which correspond to a portion of the propagation paths of oscillatory waves generated from the oscillation electrodes of at least two of the piezoelectric resonators. Further, the propagation paths of the oscillatory waves are substantially parallel to each other so as not to intersect within the piezoelectric substrate.

In the structure described above, because of the cutouts, the oscillatory waves, which are waves of secondary vibrations of the piezoelectric resonators, have short propagation paths. Accordingly, the frequency of the secondary vibrations is heightened, and the secondary vibrations having a high frequency do not interfere with the primary vibrations of the piezoelectric resonators. Also, because the propagation paths of the secondary vibrations do not intersect, mutual interference between the secondary vibrations does not occur, and there is no possibility that an undesired oscillatory wave caused by the mutual interference between the secondary vibrations may interfere with the primary vibrations of the piezoelectric resonators.

Further, another piezoelectric device according to the preferred embodiments of the present invention comprises a plurality of piezoelectric resonators disposed on a piezoelectric substrate, each of the piezoelectric resonators being formed by a plurality of oscillation electrodes, and oscillatory waves of at least two of the piezoelectric resonators which are generated from the respective gaps between the oscillation electrodes have propagation paths which are substantially parallel to each other so as not to intersect within the substrate.

The oscillatory waves generated from the gaps between the oscillation electrodes are waves of secondary vibrations of the piezoelectric resonators. The oscillatory waves are propagated on the surface of the substrate. However, since the piezoelectric resonators are arranged out of the propagation paths of the secondary vibrations of each other, the secondary vibrations do not interfere with the primary vibrations of each other. Further, since the propagation paths of the secondary vibrations do not intersect, mutual interference between the secondary vibrations does not occur, and there is no possibility that an undesired oscillatory wave caused by the mutual interference between the secondary vibrations may interfere with the primary vibrations of the piezoelectric resonators.

BRIEF DESCRIPTION OF THE DRAWINGS

This and other objects and features of the preferred embodiments of the present invention will be apparent from the following description with reference to the accompanying drawings, in which.

DETAILED DESCRIPTION OF THE PREFERRED EMBODIMENTS

Some preferred embodiments of the present invention are described with reference to the accompanying drawings.

Figure 1:
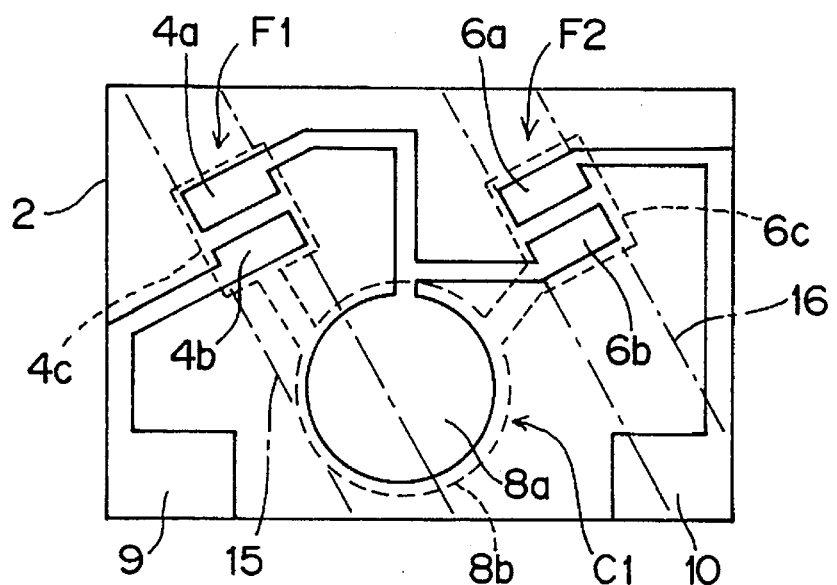
FIG. 1 is a plan view of a piezoelectric substrate used in a piezoelectric device which is a first preferred embodiment of the present invention.

FIG. 1 shows a piezoelectric substrate 2, preferably used in a piezoelectric device 1 which is a first preferred embodiment of the present invention. On the piezoelectric substrate 2, two energy-trap type piezoelectric resonators F1 and F2, and a coupling capacitor C1 are provided. The piezoelectric substrate 2 preferably is a ceramic plate made of $Pb(Zr-Ti)O_3$, $BaTiO_3$ a or the like.

The piezoelectric resonator F1 is located in the left portion of the substrate 2 in FIG. 1 and comprises oscillation electrodes 4a and 4b which are disposed on a side (the surface in FIG. 1) of the substrate 2 and an oscillation electrode 4c which is disposed on the other side (the reverse side in FIG. 1) of the substrate 2 so as to be opposite the electrodes 4a and 4b. The piezoelectric resonator F2 is located in the right portion of the substrate 2 and comprises oscillation electrodes 6a and 6b which are disposed on the surface of the substrate 2 shown in FIG. 1 and an oscillation electrode 6c which is disposed on the reverse side of the substrate 2 so as to be opposite the electrodes 6a and 6c. The electrodes 4a and 6b are electrically connected to each other, and the electrodes 4c and 6c are electrically connected to each other.

Numerals 15 and 16 denote propagation paths of secondary vibrations generated by the piezoelectric resonators F1 and F2, respectively. These propagation paths 15 and 16 are slanted or inclined relative to the peripheral edges of the substrate 2 and are substantially parallel to each other so that the paths 15 and 16 do not intersect within the substrate 2.

The coupling capacitor C1 is disposed in the center of the substrate 2 and comprises capacitor electrodes 8a and 8b which are disposed on the substrate surface shown in FIG. 1 and on the reverse side of the substrate 2, respectively, so as to be opposite each other. The capacitor electrode 8a is electrically connected to the oscillation electrodes 4a and 6b, and the capacitor electrode 8b is electrically connected to the oscillation electrodes 4c and 6c.

On the surface of the piezoelectric substrate 2, an input electrode 9 and an output electrode 10 are disposed in the left portion and in the right portion respectively.

Figure 2:
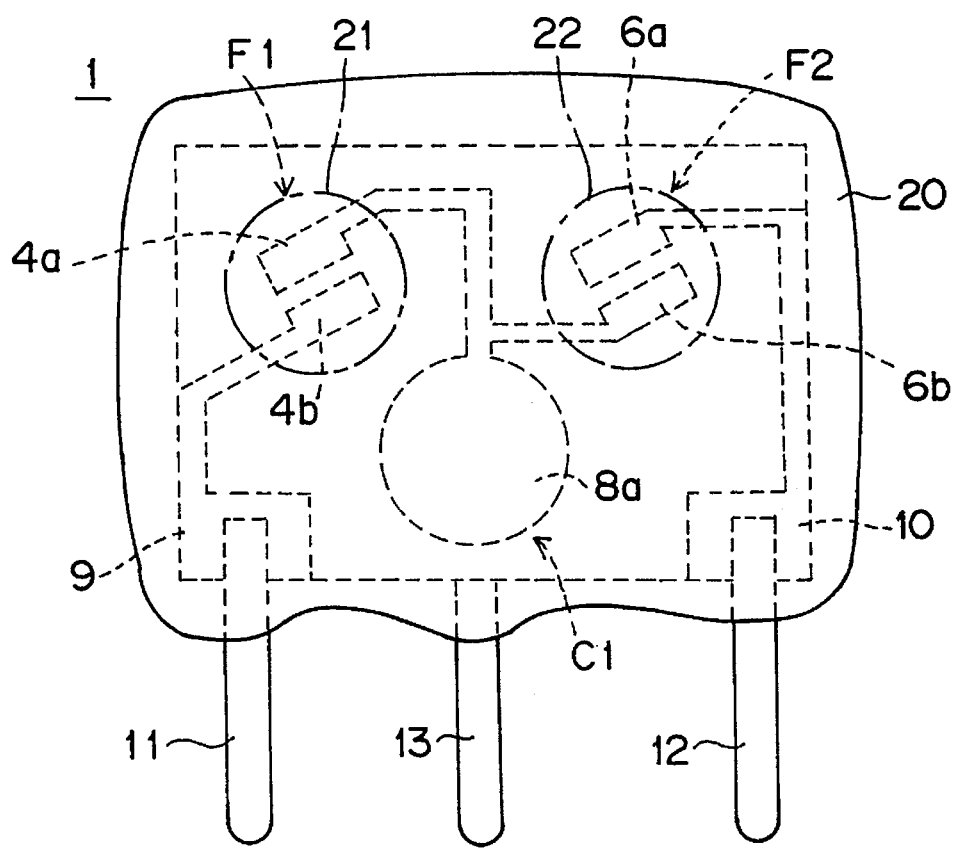
FIG. 2 is a plan view of the piezoelectric device of preferred the first embodiment.

Further, as shown in FIG. 2, an input terminal 11, an output terminal 12 and a common terminal 13 are preferably soldered to the input electrode 9, the output electrode 10 and the capacitor electrode 8b, respectively.

Next, wax, paraffin or the like is preferably is coated over the piezoelectric resonators F1 and F2. Thereafter, melted armor resin is deposited on the piezoelectric substrate 2 by dipping or the like. Then, the armor resin is hardened by heat, and simultaneously the wax or paraffin fuses into the armor resin. Thus, the piezoelectric substrate 2 is housed in an armor 20 with the piezoelectric resonators F1 and F2 contained in cavities 21 and 22. A heat resisting and thermosetting resin, such as epoxy resin, is preferably used as the material of the armor 20.

Figure 3:
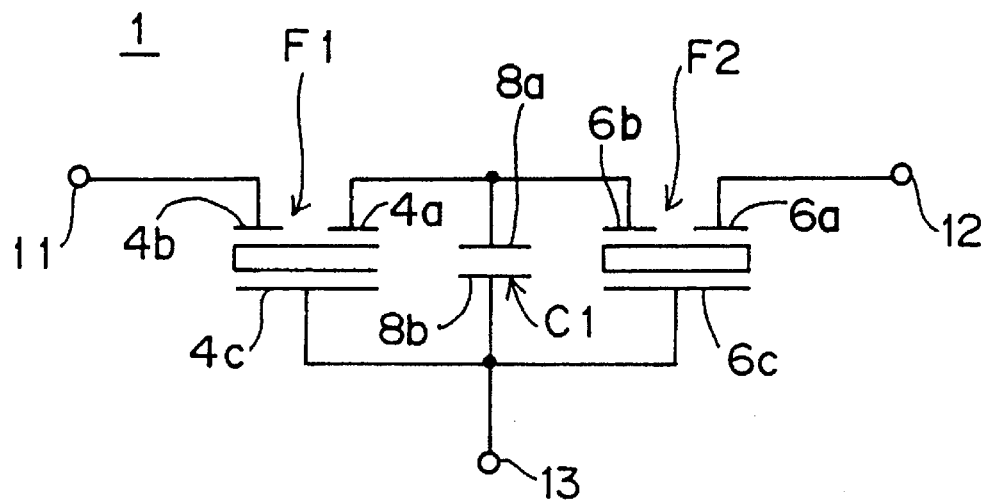
FIG. 3 is an electric equivalent circuit diagram of the piezoelectric device of FIG. 2.

FIG. 3 shows the electric equivalent circuit of the piezoelectric device 1 of the above structure. The piezoelectric resonators F1 and F2 are connected in parallel with the coupling capacitor C1 located therebetween. The piezoelectric device 1 functions as a piezoelectric filter.

Next, referring to FIG. 1, advantages of the piezoelectric device 1 are described.

When a voltage is supplied to the piezoelectric resonator F1 through the input terminal 11, a primary vibration in a direction of the thickness of the substrate 2 occurs between the oscillation electrodes 4a and 4b on the face and the oscillation electrode 4c on the reverse side. Simultaneously, the resonator F1 generates a secondary vibration in a direction on the surface of the substrate 2. The secondary vibration, in the form of an oscillatory wave, is propagated on the propagation path 15 from the oscillation electrodes 4a and 4b. The oscillatory wave of the secondary vibration is reflected on the peripheral edges of the substrate 2 and returns to the piezoelectric resonator F1. The propagation path 15 is slanted or inclined relative to the peripheral edges of the substrate 2 and accordingly obtains a large length, and thereby, the frequency of the secondary vibration is lowered. Consequently, the secondary vibration which returns to the piezoelectric resonator F1 does not interfere with the primary vibration of the resonator F1. For the same reason, a secondary vibration of the piezoelectric resonator F2 does not interfere with a primary vibration thereof.

Further, since the propagation paths 15 and 16 do not intersect, mutual interference between the secondary vibrations of the piezoelectric resonators F1 and F2 does not occur, and there is no possibility that an undesired oscillatory wave caused by the mutual interference between the secondary vibrations may interfere with the primary vibrations of the resonators F1 and F2.

Thus, the piezoelectric device 1 has no mutual interferences between the piezoelectric resonators and has a good spurious characteristic.

Figure 4:
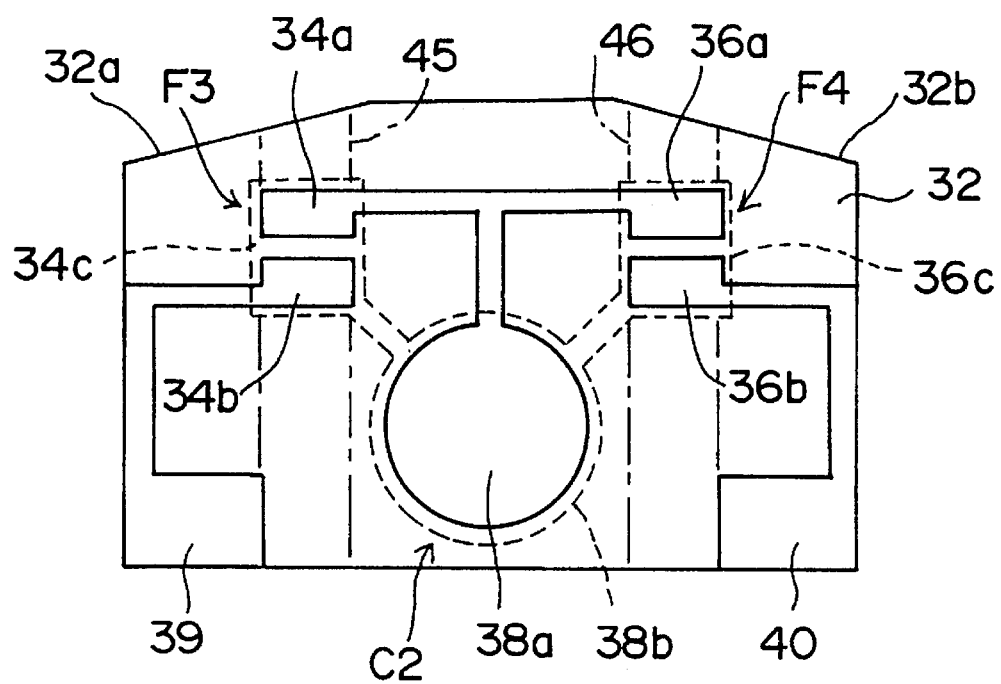
FIG. 4 is a plan view of a piezoelectric substrate used in a piezoelectric device which is a second preferred embodiment of the present invention.

FIG. 4 shows a piezoelectric substrate 32 used in a piezoelectric device which is a second preferred embodiment of the present invention. On the piezoelectric substrate 32, two energy-trap type piezoelectric resonators F3 and F4, and a coupling capacitor C2 are provided. The piezoelectric substrate 32 has cutouts 32a and 32b forming inclined edge portions on the upper edge in the right and left portions viewed in FIG. 4.

The piezoelectric resonator F3 is located in the left portion of the substrate 32 in FIG. 4 and comprises oscillation electrodes 34a and 34b which are disposed on a side (the surface in FIG. 4) of the substrate 32 and an oscillation electrode 34c which is disposed on the other side (the reverse side in FIG. 4) of the substrate 32 so as to be opposite the electrodes 34a and 34b. The piezoelectric resonator F4 is located in the right portion of the substrate 32 and comprises oscillation 36a and 36b which are disposed on the surface of the substrate 32 and an oscillation 36c which is disposed on the reverse side of the substrate 32 so as to be opposite the electrodes 36a and 36b. The electrodes 34a and 36a are electrically connected to each other, and the electrodes 34c and 36c are electrically connected to each other.

Numerals 45 and 46 denote propagation paths of secondary vibrations generated by the piezoelectric resonators F4 and F5. The propagation paths 45 and 46 are parallel to the vertical (viewed in FIG. 4) edges of the substrate 32 and do not intersect within the substrate 32. Because of the cutouts 32a and 32b, the propagation paths 45 and 46 of the secondary vibrations are shorter than those of a conventional piezoelectric device.

The coupling capacitor C2 is disposed in the center of the substrate 32 and comprises capacitor electrodes 38a and 38b which are disposed on the surface and on the reverse side respectively, so as to be disposed opposite each other. The capacitor electrode 38a is electrically connected to the oscillation electrodes 34a and 36a, and the capacitor electrode 38b is electrically connected to the oscillation electrodes 34c and 36c.

On the surface of the piezoelectric substrate 32, an input electrode 39 and an output electrode 40 are disposed in the left portion and in the right portion respectively. The electrodes 39 and 40 are electrically connected to the oscillation electrodes 34b and 36b, respectively.

Further, lead terminals are soldered to the capacitor electrode 38, the input electrode 39 and the output electrode 40, respectively. Then, in the same manner as described in the first preferred embodiment, the piezoelectric substrate 32 is preferably housed in an armor with the piezoelectric resonators F3 and F4 contained in cavities. The piezoelectric device produced in this way functions as a piezoelectric filter.

In the piezoelectric device of the above structure, a secondary vibration generated by the piezoelectric resonator F3 is propagated on the propagation path 45 in the form of an oscillatory wave. The propagation path 45 is short because of the cutout 34a, and consequently, the frequency of the secondary vibration is increased. Thereby, the secondary vibration which returns to the resonator F3 does not interfere with a primary vibration of the resonator F3. For the same reason, a secondary vibration of the piezoelectric resonator F4 does not interfere with a primary vibration of the resonator F4.

Further, because the propagation paths 45 and 46 do not intersect, mutual interference between the secondary vibrations of the piezoelectric resonators F3 and F4 does not occur, and there is no possibility that an undesired oscillatory wave caused by the mutual interference between the secondary vibrations may interfere with the primary vibrations of the resonators F3 and F4.

Consequently, the piezoelectric device of the second preferred embodiment has no mutual interferences between the piezoelectric resonators and has a good spurious characteristic.

Figure 5:
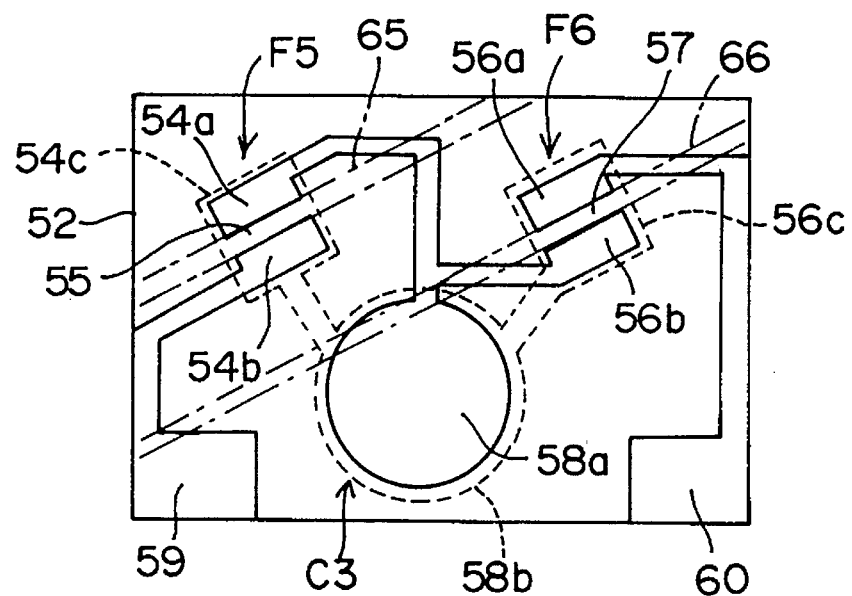
FIG. 5 is a plan view of a piezoelectric substrate used in a piezoelectric device which is a third preferred embodiment of the present invention.

FIG. 5 shows a piezoelectric substrate 52 used in a piezoelectric device 51 which is a third preferred embodiment of the present invention. On the piezoelectric substrate 52, two energy-trap type piezoelectric resonators F5 and F6, and a coupling capacitor C3 are provided.

The piezoelectric resonator F5 is disposed in the left portion of the substrate 52 in FIG. 5 and comprises oscillation electrodes 54a and 54b which are disposed on a side (the surface in FIG. 5) of the substrate 52 and an oscillation electrode 54c which is disposed on the other side (the reverse side in FIG. 5) of the substrate 52 so as to be disposed opposite the electrodes 54a and 54b. The piezoelectric resonator F6 is disposed in the right portion of the substrate 52 and comprises oscillation electrodes 56a and 56b which are disposed on the surface of the substrate 52 and an oscillation electrode 56c which is disposed on the reverse side of the substrate 52 so as to be opposite the electrodes 56a and 56b. The electrodes 54a and 56b are electrically connected to each other, and the electrode 54c and 56c are electrically connected to each other.

The piezoelectric resonator F5 has a gap 55 located between the oscillation electrodes 54a and 54b, and the piezoelectric resonator F6 has a gap 57 between the oscillation electrodes 56a and 56b. The gaps 55 and 57 are slanted or inclined relative to the peripheral edges of the substrate 52 and are parallel to each other. Numerals 65 and 66 which indicate paths extending from the gaps 55 and 57 are propagation paths of secondary vibrations of the resonators F5 and F6. The propagation paths 65 and 66 are substantially parallel to each other and do not intersect within the substrate 52.

The coupling capacitor C3 located in the center of the substrate 52 and comprises capacitor electrodes 58a and 58b which are disposed on the substrate surface shown in FIG. 5 and the reverse side of the substrate 52, respectively, so as to be opposite each other. The capacitor electrode 58a is electrically connected to the oscillation electrodes 54a and 56b, and the capacitor electrode 58b is electrically connected to the oscillation electrodes 54c and 56c.

On the surface of the substrate 52, an input electrode 59 and an output electrode 60 are disposed in the left portion and in the right portion respectively. The electrodes 59 and 60 are electrically connected to the oscillation electrodes 54b and 56a respectively.

Figure 6:
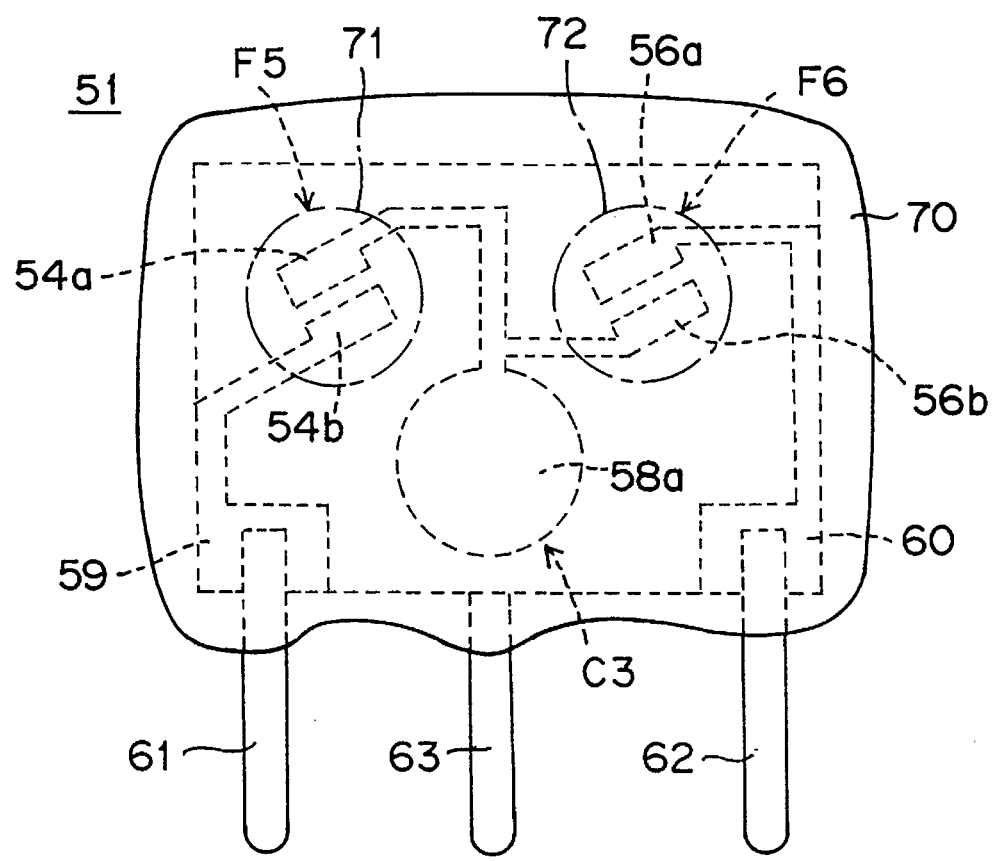
FIG. 6 is a plan view of the piezoelectric device of the third preferred embodiment.

Further, as shown in FIG. 6, an input terminal 61, an output terminal 62 and a common terminal 63 are preferably soldered to the input electrode 59, the output electrode 60 and the capacitor electrode 58b respectively.

Next, the piezoelectric substrate 52 is housed in an armor 70 with the piezoelectric resonators F5 and F6 contained in cavities 71 and 72.

Figure 7:
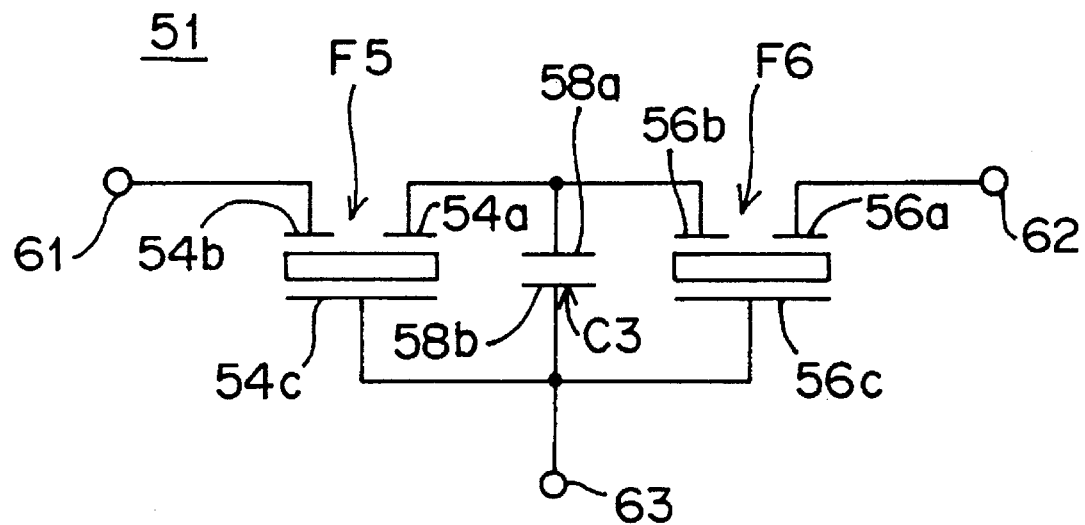
FIG. 7 is an electric equivalent circuit diagram of the piezoelectric device of the third preferred embodiment.

FIG. 7 shows the electric equivalent circuit of the piezoelectric device 51. The piezoelectric resonators F5 and F6 are connected in parallel with the coupling capacitor C3 located therebetween. The piezoelectric device 51 functions as a piezoelectric filter.

Next, referring to FIG. 5, advantages of the piezoelectric device 51 are described.

When a voltage is supplied to the piezoelectric resonator F5 through the input terminal 61, a primary vibration in a direction of the thickness of the substrate 52 occurs between the oscillation electrodes 54a and 54b on the substrate surface, and the oscillation electrode 54c on the reverse side. Simultaneously, the resonator F5 generates a secondary vibration in a direction on the surface of the substrate 52. The secondary vibration, in the form of an oscillatory wave, is propagated on the propagation path 65 from the gap 55. Since the other piezoelectric resonator F6 is located outside of the propagation path 65, the secondary vibration of the resonator F5 does not interfere with a primary vibration of the resonator F6. Likewise, a secondary vibration of the piezoelectric resonator F6, in the form of an oscillatory wave, is propagated on the propagation path 66 from the gap 57. Because the resonator F5 is located outside of the propagation path 66, the secondary vibration of the resonator F6 does not interfere with the primary vibration of the resonator F5.

Further, because the propagation paths 65 and 66 do not intersect, mutual interference between the secondary vibrations of the piezoelectric resonators F5 and F6 does not occur, and there is no possibility that an undesired oscillatory wave caused by the mutual interference between the secondary vibrations may interfere with the primary vibrations of the resonators F5 and F6.

Consequently, the piezoelectric device 51 has no mutual interferences between the piezoelectric resonators and has a good spurious characteristic.

Figure 8:
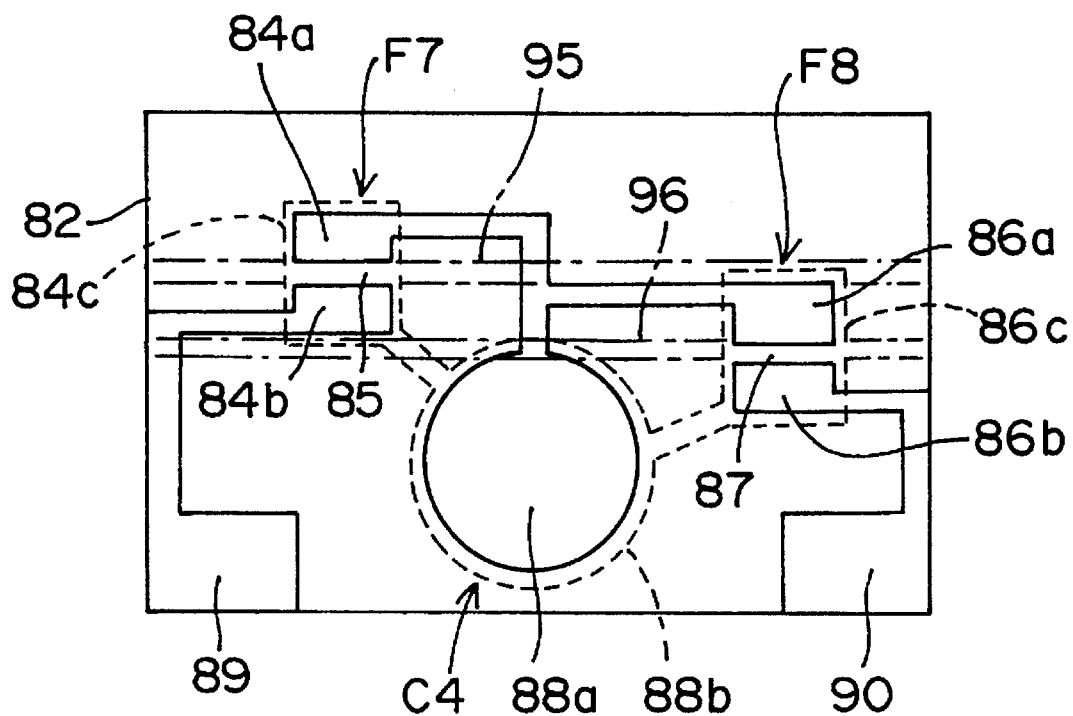
FIG. 8 is a plan view of a piezoelectric substrate used in a piezoelectric device which is a fourth preferred embodiment of the present invention.

FIG. 8 shows a piezoelectric substrate 82 used in a piezoelectric device which is a fourth preferred embodiment of the present invention. On the piezoelectric device 82, two energy-trap type piezoelectric resonators F7 and F8, and a coupling capacitor C4 are provided.

The piezoelectric resonator F7 is located in the left portion of the substrate 82 in FIG. 8 and comprises oscillation electrodes 84a and 84b which are disposed on a side (the surface in FIG. 8) of the substrate 82 and an oscillation electrode 84c which is disposed on the other side (the reverse side in FIG. 8) of the substrate 82 so as to be opposite the electrodes 84a and 84b. The piezoelectric resonator F8 is located in the right portion of the substrate 82 in FIG. 8 and comprises oscillation electrodes 86a and 86b which are disposed on the surface of the substrate 82 and an oscillation electrode 86c which is disposed on the reverse side of the substrate 82 so as to be opposite the electrodes 84a and 84b. The oscillation electrodes 84a and 86a are electrically connected to each other, and the oscillation electrodes 84c and 86c are electrically connected to each other.

The piezoelectric resonator F7 has a gap 85 located between the oscillation electrodes 84a and 84b, and the piezoelectric resonator F8 has a gap 87 located between the oscillation electrodes 86a and 86b. The gaps 85 and 87 are parallel to the horizontal (viewed in FIG. 8) edges of the substrate 82. Numerals 95 and 96 which indicate paths extended from the gaps 85 and 87 are propagation paths of secondary vibrations of the resonators F7 and F8. The propagation paths 95 and 96 are parallel to each other and do not intersect within the substrate 82.

The coupling capacitor C4 is located in the center of the substrate 82 and comprises capacitor electrodes 88a and 88b which are disposed on the substrate surface shown in FIG. 8 and on the reverse side of substrate 82 so as to be opposite each other. The capacitor electrode 88a is electrically connected to the oscillation electrodes 84a and 86a, and the capacitor electrode 88b is electrically connected to the oscillation electrodes 84c and 86c.

On the surface of piezoelectric substrate 82, an input electrode 89 and an output electrode 90 are provided in the left portion and in the right portion respectively. The electrodes 89 and 90 are electrically connected to the oscillation electrodes 84b and 86b, respectively.

Further, lead terminals are soldered to the capacitor electrode 88b, the input electrode 89 and the output electrode 90. Then, the piezoelectric substrate 82 is housed in an armor with the piezoelectric resonators F7 and F8 contained in cavities. The piezoelectric device which is produced in this way functions as a piezoelectric filter.

The piezoelectric device of the fourth preferred embodiment has the same advantages as the third preferred embodiment.

Piezoelectric resonators on a piezoelectric substrate may have any configuration and layout. For example, when three piezoelectric resonators are provided, it is not necessary that all the three resonators have propagation paths of secondary vibrations which are slanted or inclined relative to the edges of the substrate and are substantially parallel to one another not to intersect within the substrate. What is necessary is that any two of the three resonators have propagation paths of secondary vibrations which meet the above conditions.

Figure 9:
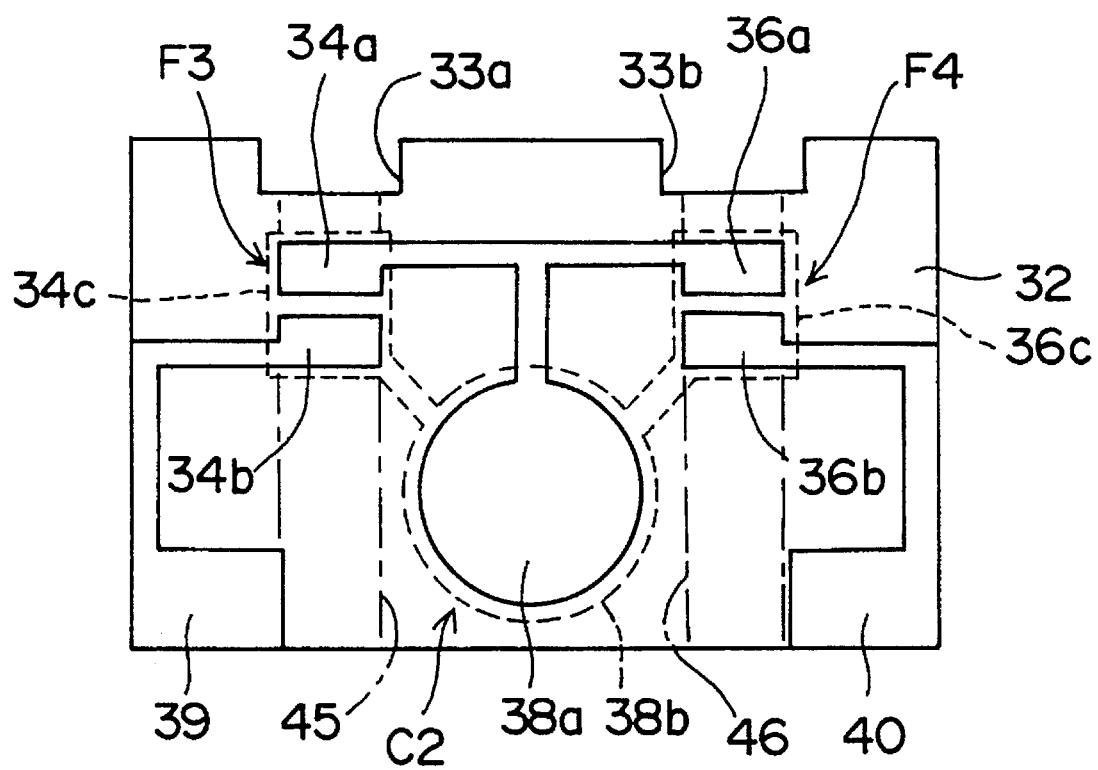
FIG. 9 is a plan view of a modified piezoelectric device of the second preferred embodiment.

In the preferred second embodiment, the cutouts of the substrate may be of any shape. As shown in FIG. 9, the substrate 32 may have cutouts 33a and 33b which are formed in the propagation paths 45 and 46. Further, the propagation paths 45 and 46 do not have to be parallel to the vertical edges of the substrate 32 and may be slanted or inclined relative to the edges of the substrate 32.

Although the present invention has been described in connection with the preferred embodiments above, it is to be noted that various changes and modifications are possible to those who are skilled in the art. Such changes and modifications are to be understood as being within the scope of the present invention.

What is claimed is:

1. A piezoelectric device comprising:
   a substantially rectangular piezoelectric substrate having a plurality of peripheral edges; and
   a plurality of piezoelectric resonators provided on the piezoelectric substrate, each of the piezoelectric resonators including a plurality of oscillation electrodes; wherein at least two of the piezoelectric resonators are arranged on the piezoelectric substrate to have propagation paths of vibration waves which are slanted relative to the peripheral edge of the piezoelectric substrate and are substantially parallel to each other.

2. A piezoelectric device as claimed in claim 1, wherein:

each of the plurality of piezoelectric resonators comprise energy-trap type resonators.

3. A piezoelectric device as claimed in claim 1, further comprising:

a coupling capacitor which is electrically connected between two of the piezoelectric resonators.

4. A piezoelectric device as claimed in claim 1, further comprising:

an armor which has internal cavities for containing the piezoelectric resonators.

5. A piezoelectric device comprising:

a substantially rectangular piezoelectric substrate having a plurality of peripheral edges; and a plurality of piezoelectric resonators provided on the piezoelectric substrate, each of the piezoelectric resonators including a plurality of oscillation electrodes; wherein at least two of the piezoelectric resonators are arranged on the piezoelectric substrate to have propagation paths of vibration waves which are propagated from the oscillation electrodes of the respective piezoelectric resonators, the propagation paths being substantially parallel to each other; and at least one of the peripheral edges of the piezoelectric substrate has slanted edge portions each of which is arranged to be slanted relative to an adjacent one of the peripheral edges, each of the slanted edge portions being located to intersect with a respective one of the propagation paths of the vibration waves.

6. A piezoelectric device as claimed in claim 5, wherein:

each of the plurality of piezoelectric resonators comprise energy-trap type resonators.

7. A piezoelectric device as claimed in claim 5, further comprising:

a coupling capacitor which is electrically connected between two of the piezoelectric resonators.

8. A piezoelectric device as claimed in claim 5, wherein:

each of the propagation paths is substantially parallel to at least one of the plurality of peripheral edges of the piezoelectric substrate.

9. A piezoelectric device comprising;

a substantially rectangular piezoelectric substrate having a plurality of peripheral edges; and a plurality of piezoelectric resonators provided on the piezoelectric substrate, each of the piezoelectric resonators including a pair of oscillation electrodes being separated from each other by a gap; wherein each of at least two of the piezoelectric resonators are arranged on the piezoelectric substrate to have a respective propagation path of vibration waves which are propagated from an opening of the respective gap defined by the respective pair of oscillation electrodes, the propagation paths being slanted relative to the peripheral edges of the piezoelectric substrate and being substantially parallel to each other.

10. A piezoelectric device as claimed in claim 9, wherein:

each of the plurality of piezoelectric resonators comprise energy-trap type resonators.

11. A piezoelectric device as claimed in claim 9, further comprising:

a coupling capacitor which is electrically connected between two of the piezoelectric resonators.

12. A piezoelectric device as claimed in claim 9, further comprising:

an armor which has internal cavities for containing the piezoelectric resonators.

13. A piezoelectric device as claimed in claim 5, wherein the propagation paths of the vibration waves are slanted relative to the peripheral edges of the piezoelectric substrate.

14. A piezoelectric device comprising:

a piezoelectric substrate having a plurality of peripheral edges;

a plurality of piezoelectric resonators provided on the piezoelectric substrate, each of the piezoelectric resonators including a plurality of oscillation electrodes; wherein at least two of the piezoelectric resonators are arranged on the piezoelectric substrate to have propagation paths of vibration waves propagating from the oscillation electrodes, the propagation paths being substantially parallel to each other; and at least one of the peripheral edges of the piezoelectric substrate having a plurality of cutout portions located spaced from the oscillation electrodes, each of the cutout portions being arranged to intersect with a respective one of the propagation paths of the vibration waves.

15. The piezoelectric device of claim 14, wherein the propagation paths are substantially parallel to at least one of the peripheral edges of the piezoelectric substrate.

16. A piezoelectric device as claimed in claim 14, wherein:

each of the plurality of piezoelectric resonators comprise energy-trap type resonators.

17. A piezoelectric device as claimed in claim 14, further comprising:

a coupling capacitor which is electrically connected between two of the piezoelectric resonators.

18. A piezoelectric device as claimed in claim 14, further comprising:

an armor which has internal cavities for containing the piezoelectric resonators.

* * * * *